(12) United States Patent
Stager et al.

(10) Patent No.: US 7,437,492 B2
(45) Date of Patent: Oct. 14, 2008

(54) METHOD AND SYSTEM FOR DATA COMPRESSION AND COMPRESSION ESTIMATION IN A VIRTUAL TAPE LIBRARY ENVIRONMENT

(75) Inventors: Roger Stager, Livermore, CA (US); Don Alvin Trimmer, Livermore, CA (US); Craig Anthony Johnston, Livermore, CA (US); Rico Blaser, San Francisco, CA (US)

(73) Assignee: Netapp, Inc, Sunnyvale, CA (US)

( * ) Notice: Subject to any disclaimer, the term of this patent is extended or adjusted under 35 U.S.C. 154(b) by 894 days.

(21) Appl. No.: 10/436,612

(22) Filed: May 14, 2003

(65) Prior Publication Data

US 2004/0230724 A1   Nov. 18, 2004

(51) Int. Cl.
*G06F 3/00* (2006.01)
*G06F 13/12* (2006.01)
*G06F 13/28* (2006.01)

(52) U.S. Cl. ............... 710/68; 710/17; 710/19; 710/57; 710/74; 711/111; 711/112; 711/113

(58) Field of Classification Search ......... 711/111–113; 710/5, 6, 15–17, 19, 56, 57, 68, 74
See application file for complete search history.

(56) References Cited

U.S. PATENT DOCUMENTS

| | | | |
|---|---|---|---|
| 4,635,145 A | 1/1987 | Horie et al. |
| 4,727,512 A | 2/1988 | Birkner et al. |
| 4,775,969 A | 10/1988 | Osterlund |
| 5,235,695 A | 8/1993 | Pence |
| 5,297,124 A | 3/1994 | Plotkin et al. |
| 5,438,674 A | 8/1995 | Keele et al. |
| 5,455,926 A | 10/1995 | Keele et al. |
| 5,485,321 A | 1/1996 | Leonhardt et al. |
| 5,666,538 A | 9/1997 | DeNicola |
| 5,673,382 A | 9/1997 | Cannon et al. |
| 5,774,292 A | 6/1998 | Georgiou et al. |
| 5,774,715 A | 6/1998 | Madany et al. |
| 5,805,864 A | 9/1998 | Carlson et al. |
| 5,809,511 A | 9/1998 | Peake |
| 5,809,543 A | 9/1998 | Byers et al. |
| 5,854,720 A | 12/1998 | Shrinkle et al. |

(Continued)

FOREIGN PATENT DOCUMENTS

EP          1333379          4/2006

(Continued)

OTHER PUBLICATIONS

"Alacritus Software's Securitus I: Pointing the Way to Virtual Tape Libraries" Aberdeen Group, Inc., Mar. 2002.

(Continued)

*Primary Examiner*—Alan Chen
(74) *Attorney, Agent, or Firm*—Perkins Coie LLP

(57) ABSTRACT

A method and system for efficiently storing and transferring data in a virtual tape library environment is disclosed. Data is written to a virtual tape library that emulates a physical tape library. Data stored in the virtual tape library may be compressed and an estimated compression ratio may be dynamically computed. While data is written to the virtual tape library, an end-of-tape signal is provided based on the estimated compression ratio.

16 Claims, 3 Drawing Sheets

U.S. PATENT DOCUMENTS

| | | | |
|---|---|---|---|
| 5,864,346 | A | 1/1999 | Yokoi et al. |
| 5,872,669 | A | 2/1999 | Morehouse et al. |
| 5,875,479 | A | 2/1999 | Blount et al. |
| 5,911,779 | A | 6/1999 | Stallmo et al. |
| 5,949,970 | A | 9/1999 | Sipple et al. |
| 5,961,613 | A | 10/1999 | DeNicola |
| 5,963,971 | A | 10/1999 | Fosler et al. |
| 6,021,408 | A | 2/2000 | Ledain et al. |
| 6,023,709 | A | 2/2000 | Anglin et al. |
| 6,029,179 | A | 2/2000 | Kishi |
| 6,041,329 | A | 3/2000 | Kishi |
| 6,044,442 | A | 3/2000 | Jesionowski |
| 6,049,848 | A | 4/2000 | Yates et al. |
| 6,061,309 | A | 5/2000 | Gallo et al. |
| 6,067,587 | A | 5/2000 | Miller et al. |
| 6,070,224 | A | 5/2000 | LeCrone et al. |
| 6,098,148 | A | 8/2000 | Carlson |
| 6,128,698 | A | 10/2000 | Georgis |
| 6,131,142 | A | 10/2000 | Kamo et al. |
| 6,131,148 | A | 10/2000 | West et al. |
| 6,163,856 | A | 12/2000 | Dion et al. |
| 6,173,359 | B1 | 1/2001 | Carlson et al. |
| 6,195,730 | B1 | 2/2001 | West |
| 6,225,709 | B1 | 5/2001 | Nakajima |
| 6,247,096 | B1 | 6/2001 | Fisher et al. |
| 6,260,110 | B1 | 7/2001 | LeCrone et al. |
| 6,266,784 | B1 | 7/2001 | Hsiao et al. |
| 6,269,423 | B1 | 7/2001 | Kishi |
| 6,269,431 | B1 | 7/2001 | Dunham |
| 6,282,609 | B1 | 8/2001 | Carlson |
| 6,289,425 | B1 | 9/2001 | Blendermann et al. |
| 6,292,889 | B1 | 9/2001 | Fitzgerald et al. |
| 6,301,677 | B1 | 10/2001 | Squibb |
| 6,304,880 | B1 | 10/2001 | Kishi |
| 6,304,882 | B1 | 10/2001 | Strellis et al. |
| 6,317,814 | B1 | 11/2001 | Blendermann et al. |
| 6,324,497 | B1 | 11/2001 | Yates et al. |
| 6,327,418 | B1 | 12/2001 | Barton |
| 6,336,163 | B1 | 1/2002 | Brewer et al. |
| 6,336,173 | B1 | 1/2002 | Day et al. |
| 6,339,778 | B1 | 1/2002 | Kishi |
| 6,341,329 | B1 | 1/2002 | LeCrone et al. |
| 6,343,342 | B1 | 1/2002 | Carlson |
| 6,353,837 | B1 | 3/2002 | Blumenau |
| 6,360,232 | B1 | 3/2002 | Brewer et al. |
| 6,389,503 | B1 | 5/2002 | Georgis et al. |
| 6,408,359 | B1 | 6/2002 | Ito et al. |
| 6,487,561 | B1 | 11/2002 | Ofek et al. |
| 6,496,791 | B1 | 12/2002 | Yates et al. |
| 6,499,026 | B1 | 12/2002 | Rivette et al. |
| 6,557,073 | B1 | 4/2003 | Fujiwara |
| 6,557,089 | B1 | 4/2003 | Reed et al. |
| 6,578,120 | B1 | 6/2003 | Crockett et al. |
| 6,615,365 | B1 | 9/2003 | Jenevein et al. |
| 6,625,704 | B2 | 9/2003 | Winokur |
| 6,654,912 | B1 | 11/2003 | Viswanathan et al. |
| 6,658,435 | B1 | 12/2003 | McCall |
| 6,694,447 | B1 | 2/2004 | Leach et al. |
| 6,725,331 | B1 | 4/2004 | Kedem |
| 6,766,520 | B1 | 7/2004 | Rieschl et al. |
| 6,779,057 | B2 * | 8/2004 | Masters et al. ............. 710/52 |
| 6,779,058 | B2 | 8/2004 | Kishi et al. |
| 6,779,081 | B2 | 8/2004 | Arakawa et al. |
| 6,816,941 | B1 | 11/2004 | Carlson et al. |
| 6,816,942 | B2 * | 11/2004 | Okada et al. ............... 710/68 |
| 6,834,324 | B1 | 12/2004 | Wood |
| 6,850,964 | B1 | 2/2005 | Brough et al. |
| 6,877,016 | B1 | 4/2005 | Hart et al. |
| 6,915,397 | B2 | 7/2005 | Lubbers et al. |
| 6,931,557 | B2 | 8/2005 | Togawa |
| 6,950,263 | B2 | 9/2005 | Suzuki et al. |
| 6,957,291 | B2 | 10/2005 | Moon et al. |
| 6,973,369 | B2 | 12/2005 | Trimmer et al. |
| 6,973,534 | B2 | 12/2005 | Dawson |
| 6,978,325 | B2 | 12/2005 | Gibble |
| 7,032,126 | B2 | 4/2006 | Zalewski et al. |
| 7,032,131 | B2 | 4/2006 | Lubbers et al. |
| 7,055,009 | B2 | 5/2006 | Factor et al. |
| 7,096,331 | B1 | 8/2006 | Haase et al. |
| 7,100,089 | B1 | 8/2006 | Phelps |
| 7,107,417 | B2 | 9/2006 | Gibble et al. |
| 7,111,136 | B2 | 9/2006 | Yamagami |
| 7,127,388 | B2 | 10/2006 | Yates et al. |
| 7,143,307 | B1 | 11/2006 | Witte et al. |
| 7,155,586 | B1 | 12/2006 | Wagner et al. |
| 7,200,546 | B1 | 4/2007 | Nourmohamadian et al. |
| 2002/0004835 | A1 | 1/2002 | Yarbrough |
| 2002/0016827 | A1 | 2/2002 | McCabe et al. |
| 2002/0026595 | A1 | 2/2002 | Saitiu et al. |
| 2002/0095557 | A1 | 7/2002 | Constable et al. |
| 2002/0133491 | A1 | 9/2002 | Sim et al. |
| 2002/0144057 | A1 | 10/2002 | Li et al. |
| 2002/0163760 | A1 | 11/2002 | Lindsey et al. |
| 2002/0166079 | A1 | 11/2002 | Ulrich et al. |
| 2002/0171546 | A1 | 11/2002 | Evans et al. |
| 2002/0199129 | A1 | 12/2002 | Bohrer et al. |
| 2003/0004980 | A1 | 1/2003 | Kishi et al. |
| 2003/0037211 | A1 | 2/2003 | Winokur |
| 2003/0097462 | A1 | 5/2003 | Parent et al. |
| 2003/0120476 | A1 | 6/2003 | Yates et al. |
| 2003/0120676 | A1 | 6/2003 | Holavanahalli et al. |
| 2003/0126388 | A1 | 7/2003 | Yamagami |
| 2003/0135672 | A1 | 7/2003 | Yip et al. |
| 2003/0149700 | A1 | 8/2003 | Bolt |
| 2003/0182350 | A1 | 9/2003 | Dewey |
| 2003/0188208 | A1 | 10/2003 | Fung |
| 2003/0225800 | A1 | 12/2003 | Kavuri |
| 2004/0015731 | A1 | 1/2004 | Chu et al. |
| 2004/0098244 | A1 | 5/2004 | Dailey et al. |
| 2004/0181388 | A1 | 9/2004 | Yip et al. |
| 2004/0181707 | A1 | 9/2004 | Fujibayashi |
| 2005/0010529 | A1 | 1/2005 | Zalewski et al. |
| 2005/0044166 | A1 | 2/2005 | Liang et al. |
| 2005/0063374 | A1 | 3/2005 | Rowan et al. |
| 2005/0065962 | A1 | 3/2005 | Rowan et al. |
| 2005/0066118 | A1 | 3/2005 | Perry et al. |
| 2005/0066222 | A1 | 3/2005 | Rowan et al. |
| 2005/0066225 | A1 | 3/2005 | Rowan et al. |
| 2005/0076264 | A1 | 3/2005 | Rowan et al. |
| 2005/0076070 | A1 | 4/2005 | Mikari |
| 2005/0076261 | A1 | 4/2005 | Rowan et al. |
| 2005/0076262 | A1 | 4/2005 | Rowan et al. |
| 2005/0144407 | A1 | 6/2005 | Colgrove et al. |
| 2006/0047895 | A1 | 3/2006 | Rowan et al. |
| 2006/0047902 | A1 | 3/2006 | Passerini |
| 2006/0047903 | A1 | 3/2006 | Passerini |
| 2006/0047905 | A1 | 3/2006 | Matze et al. |
| 2006/0047925 | A1 | 3/2006 | Passerini |
| 2006/0047989 | A1 | 3/2006 | Delgado et al. |
| 2006/0047998 | A1 | 3/2006 | Darcy |
| 2006/0047999 | A1 | 3/2006 | Passerini et al. |
| 2006/0143376 | A1 | 6/2006 | Matze et al. |

FOREIGN PATENT DOCUMENTS

| | | |
|---|---|---|
| EP | 1671231 | 6/2006 |
| WO | WO1999/03098 | 1/1999 |
| WO | WO1999/06912 | 2/1999 |
| WO | WO2005/031576 | 4/2005 |
| WO | WO2006/023990 | 3/2006 |
| WO | WO2006/023991 | 3/2006 |
| WO | WO2006/023992 | 3/2006 |
| WO | WO2006/023993 | 3/2006 |
| WO | WO2006/023994 | 3/2006 |

| | | |
|---|---|---|
| WO | WO2006/023995 | 3/2006 |

OTHER PUBLICATIONS

"Product Brief: Rhapsody/Alacritus-Secritus/XPath Virtual Tape in the Fabric" The Enterprise Storage Group, Aug. 2002.

"Alacritus Software Announces Securitus I, The Industry's First Virtual Tape Library Solution: Securitus I Heralds Advent of 'Disruptive Technology' that Serves as Replacement to Tape Libraries" Alacritus Software, Inc., Jun. 25, 2001.

"Alacritus, Hitachi CP and Nissho Team to Create Virtual Tape Library Appliance: Industry's First Virtual Tape Library Appliance to Replace Storage Tape Libraries" Alacritus Software, Inc. Jun. 25, 2001.

"Hitachi CP, Nissho, and Alacritus Software Bring Virtual Tape Library Appliance Solution to Market: Three Companies Join to Deliver VTLA Smart Guard—A Disk Subsystem Product that Functions as a Virtual Storage Tape Library" Alactrius Software, Inc., Oct. 3, 2001.

Trimmer, Don, "Tape Free Backup/Recovery: Requirements and Advantages: Virtualization Technology Will Encompass Many Applications, One of the Most Significant Possibly Being Backup/Recovery" InfoStor, Mar. 2002.

"Alacritus Software Announces Virtual Tape Library for Legato NetWorker Data Protection Solution" Alacritus Software, Inc., Jan. 8, 2002.

"Alacritus Software Announces Securitus I, the Industry's First Virtual Tape Library Solution: Securitus I Heralds Advent of 'Disruptive Technology' that Serves as Replacement to Tape Libraries" Alacritus Software, Inc., Apr. 9, 2002.

Biggar, Heidi, "Disk and Tape Forge New Partnership in Backup Arena" InfoStor, Nov. 2001.

Preston, W. Curtis, "Surprise! Cheap Disks Cure Slow Backup" Storage Magazine, Jun. 1, 2002.

"Alacritus, Hitachi CP and Nissho Team to Create Virtual Tape Library" Jun. 25, 2001.

"Alacritus Software and Rhapsody Networks to Develop Breakthrough Backup Solutions for Storage Networks: Companies to Provide First Network-Intelligent Virtual Tape Solution Resulting in Dramatic ROI, Increases in Data Backup Performance and Scalability" Alacritus Software, Jul. 8, 2002.

Camphuisen, Alicia, "Hitachi Inks OEM Deal with Legato" Jul. 17, 2002.

"Alacritus Announces Disk-Based Successor to Tape" Aug. 21, 2002.

Biggar, Heidi, "Alacritus Enables Disk-Based Backup" InfoStor, Sep. 2001.

"Securitus I White Paper: Disk Based Data Protection from Alacritus Software" Alacritus Software, Inc., Jul. 2001.

"Alacritus Software FAQs" Alacritus Software, Inc., Jul. 2001.

"Disk-Based Data Protection" Alacritus Software, Inc., Jul. 2001.

"Virtual Tape Library Technology Brochure" Alacritus Software, Inc., Jul. 2001.

"Disk-Based Data Protection" Alacritus Software, Inc. Sep. 2001.

"Disk-Based Data Protection" Alacritus Software, Inc. Sep. 2002.

Payack, Paul JJ, "Alactritus Lines Up OEM Partners for Virtual Tape Library Push" The (451) Storage & Systems, Oct. 4, 2002.

Komiega, Kevin, "Vendor Pushes Disk Backup Over Tape" Search Storage.com Jan. 10, 2003.

Valtazar, Henry "Weaving Apps Into SAN Fabric" eWEEK, Mar. 24, 2003.

\* cited by examiner

METHOD AND SYSTEM FOR DATA COMPRESSION AND COMPRESSION ESTIMATION IN A VIRTUAL TAPE LIBRARY ENVIRONMENT

BACKGROUND

The present invention relates to storage and transfer of data in a virtual tape library environment. More specifically, the invention is a method and system for compressing data in a virtual tape library to conserve disk space and for computing an estimated compression ratio to provide a one-to-one correspondence in size between virtual and physical tapes.

Virtual tape libraries emulate physical tape libraries to more efficiently handle backup data. For those occasions when users need to generate physical tapes for off-site storage or data interchange, for example, the desired data must be written from the virtual tapes (which at least initially contain the data) to physical tapes. Unlike in mainframe virtual tape systems that stack multiple virtual tapes onto a single physical tape, a one-to-one correspondence in size between virtual and physical tapes is desirable in the open systems world.

The majority of modern physical tape drives perform data compression before data is stored on the physical tape media. The data compression is dependent not only on the data itself, but also a physical tape's storage capacity and a tape drive's compression algorithm. These dependencies make it impossible to statically select an appropriate data capacity for the virtual tape a priori. As an illustration, if a virtual tape is fixed to 20 GB because the physical tape is 20 GB, a large portion of the physical tape may not be used once the data is transferred from the virtual tape to the physical tape. This is because the tape drive might compress the data down to 10 GB, for example. If, on the other hand, a 30 GB virtual tape is created for a 20 GB physical tape in an attempt to account for data compression and use the physical media more efficiently, it is possible that uncompressible (random) data is written to that virtual tape. In this case, when the virtual tape is exported onto the physical tape, only the first 20 GB will fit on the physical media. While the first option is preferable, clearly neither choice is satisfactory. Therefore, it would be desirable to dynamically ensure that the amount of data written to each virtual tape is large enough not to waste physical resources while being small enough to not exceed the capacity of the physical tape.

Additionally, while physical tape drives typically compress data before writing it to tape, existing virtual tape libraries do not include this feature. This is mostly due to the great amount of processing power that is required to compress high-bandwidth data streams in real-time. It would, therefore, also be desirable to store data compactly on random access media, either in real-time (as data is written to the virtual device) or at a later time when more processing power is available. In either case, this is preferable because it keeps the footprint of virtual tapes low and thus saves comparatively expensive random access storage space.

A need therefore exists for a method and system for compressing data written to a virtual tape library (in real-time or otherwise) for efficient storage thereof and for computing an estimated compression ratio in real time to dynamically provide a one-to-one correspondence in size between virtual tapes and physical tapes.

SUMMARY

The invention is a method and system for compressing data in a virtual tape library (VTL) and for dynamically computing an estimated compression ratio. With respect to compression, data written to the VTL may be compressed for efficient storage within the virtual tape library. That is, the method and system of the present invention keeps the footprint of the virtual tapes low to conserve random access storage space by storing data compactly on random access media, either in real-time as data is being written to a virtual device or later when additional processing power is available.

With respect to the writing of data itself, an estimated compression ratio is dynamically computed so that when data is written to a VTL there is a one-to-one correspondence in size between virtual and physical tapes. The compression ratio is estimated in real time taking into account how the data will be compressed by a corresponding physical tape library. That is, the method and system of the present invention may dynamically (i.e. while data is being written) adjust the virtual tape size and return an "End-Of-Tape" (EOT) signal to the DPA once the VTL determines that the physical tape would be full if the data were to be exported. The compression and estimation aspects of the invention may be implemented together or independently, as desired.

In one embodiment, data stored in a VTL is decompressed prior to being exported. In another embodiment, the compression feature of a corresponding physical tape drive is disabled and data is exported in compressed format.

BRIEF DESCRIPTION OF THE DRAWING(S)

DETAILED DESCRIPTION OF THE PREFERRED EMBODIMENT(S)

Figure 1:
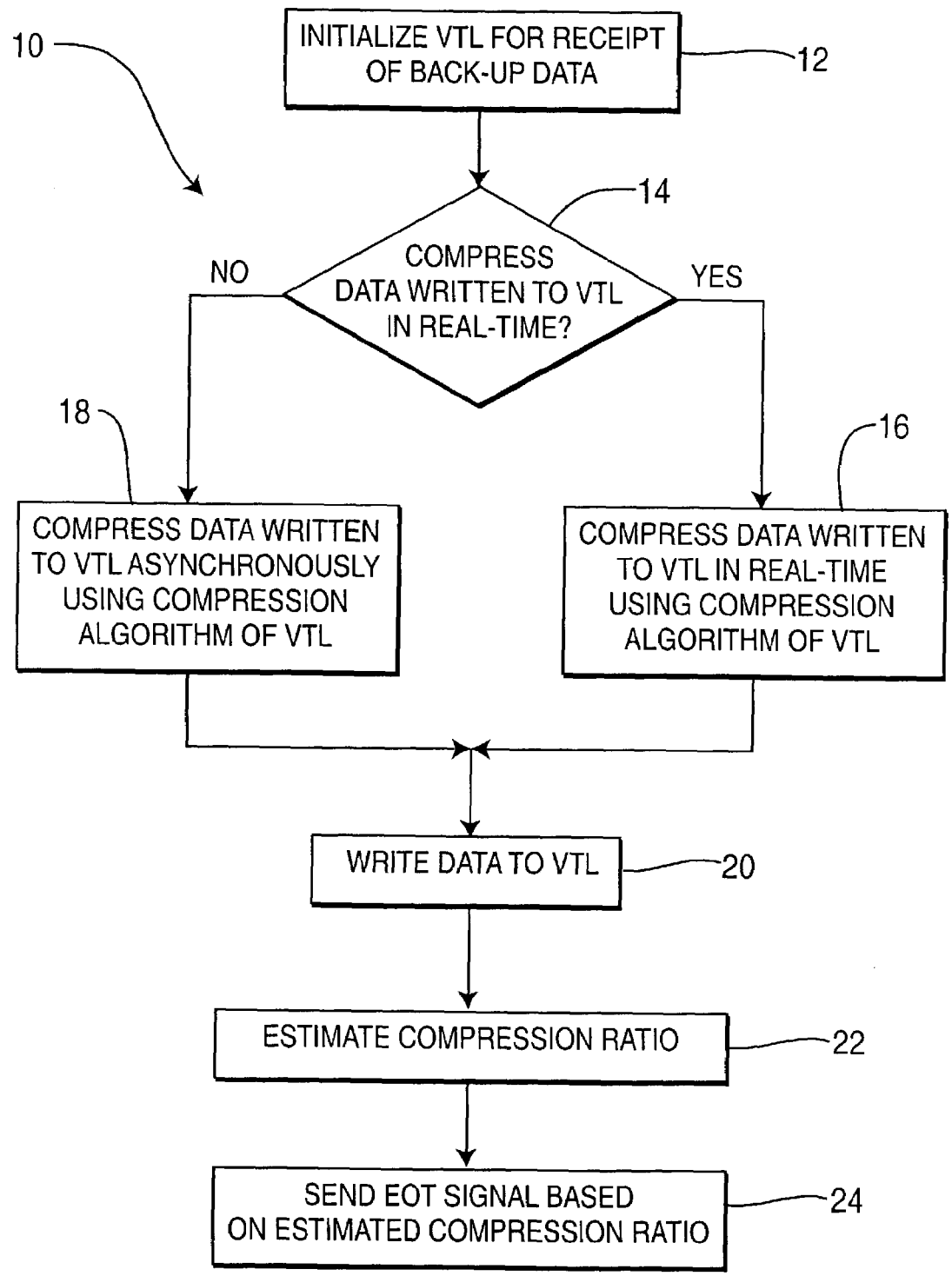
FIG. 1 is a method wherein data written to a virtual tape library is compressed to conserve disk space and an estimated compression ratio is computed to provide a one-to-one correspondence in size between virtual and physical tapes in accordance with an embodiment of the present invention.

Referring initially to FIG. 1, there is shown a method 10 for compressing data written to a virtual tape library (VTL) and computing an estimated compression ratio so that data stored in the VTL may be efficiently exported to physical tape media (i.e. with a one-to-one correspondence in size). The method 10 begins in step 12 with initializing the VTL for receipt of a back-up data stream from a data protection application (DPA). In step 14, it is determined whether to compress the current data stream that is being written to the VTL in real-time. If yes, the method 10 proceeds to step 16 wherein the data is compressed in real-time using a compression algorithm of the VTL. If no, the method 10 proceeds to step 18 wherein the data may be compressed asynchronously, as desired, again using a compression algorithm of the VTL. In either case, the compression algorithm of the VTL may or may not be the same as a compression algorithm used in one of the physical tape drives with which the VTL is associated.

Where the data is compressed asynchronously (i.e. where step 14 is negative), the data written to the VTL is saved on disk and may be compressed later (i.e. outside of the backup window), as desired. A combination of asynchronous and real-time compression may also be implemented. For example, incoming data can be compressed in real-time while enough processing power is available and stored uncompressed during periods where processing resources are being utilized for other functions. Even a 100% post-compression scheme typically works very well in this environment because typical backup configurations take advantage of a backup window at night. The remaining time can be spent compressing the data without interfering with regular business processes. This ensures that a suitable amount of free disk space is available to fit the backup data of the following day.

Regardless of whether data written to the VTL is compressed asynchronously (step 18) or in real-time (step 16) or a combination of the two, the method 10 preferably proceeds to step 20. In step 20, data is written to the VTL and compressed in accordance with the decision made at step 14.

Where the compression portion of the invention (i.e. steps 14, 16, and 18) is being implemented independently (i.e. without compression estimation), it should be noted that the method shown in FIG. 1 will end with step 20. That is, the data is simply compressed as determined in step 14 and written to the VTL in step 20. Similarly, where compression estimation (i.e. steps 22 and 24) is being implemented independently (i.e. without compressing data written to the VTL) method 10 is simply performed without steps 14, 16, and 18.

Continuing with FIG. 1, where compression and compression estimation are performed, the method 10 proceeds from step 20 to step 22. In step 22, the compression ratio that will be achieved on this data by the compression algorithm of the tape drive is estimated (i.e. an estimated compression ratio is computed). This ratio is defined as the size of the original data written by the DPA divided by the size of the same data after it has been compressed by a corresponding physical tape drive. For example, a 2:1 compression ratio indicates that a 20 GB data stream could be reduced to 10 GB in compressed format in a corresponding physical tape drive.

Computing the estimated compression ratio varies depending on whether the data stream being written to the VTL is compressed in real time or asynchronously. Where data written to the VTL is compressed asynchronously, the compression ratio may be estimated by compressing random samples of data written to the VTL and compressing them according to the compression algorithm of a particular tape drive(s) with which the VTL corresponds or is otherwise associated with. Where the VTL is associated with more than one tape drive, each tape drive's respective compression algorithm could potentially be used for dynamically computing an estimated compression ratio for data written to any of the tape drives. Alternatively, multiple algorithms could be run and the lowest estimate could be used.

Figure 2:
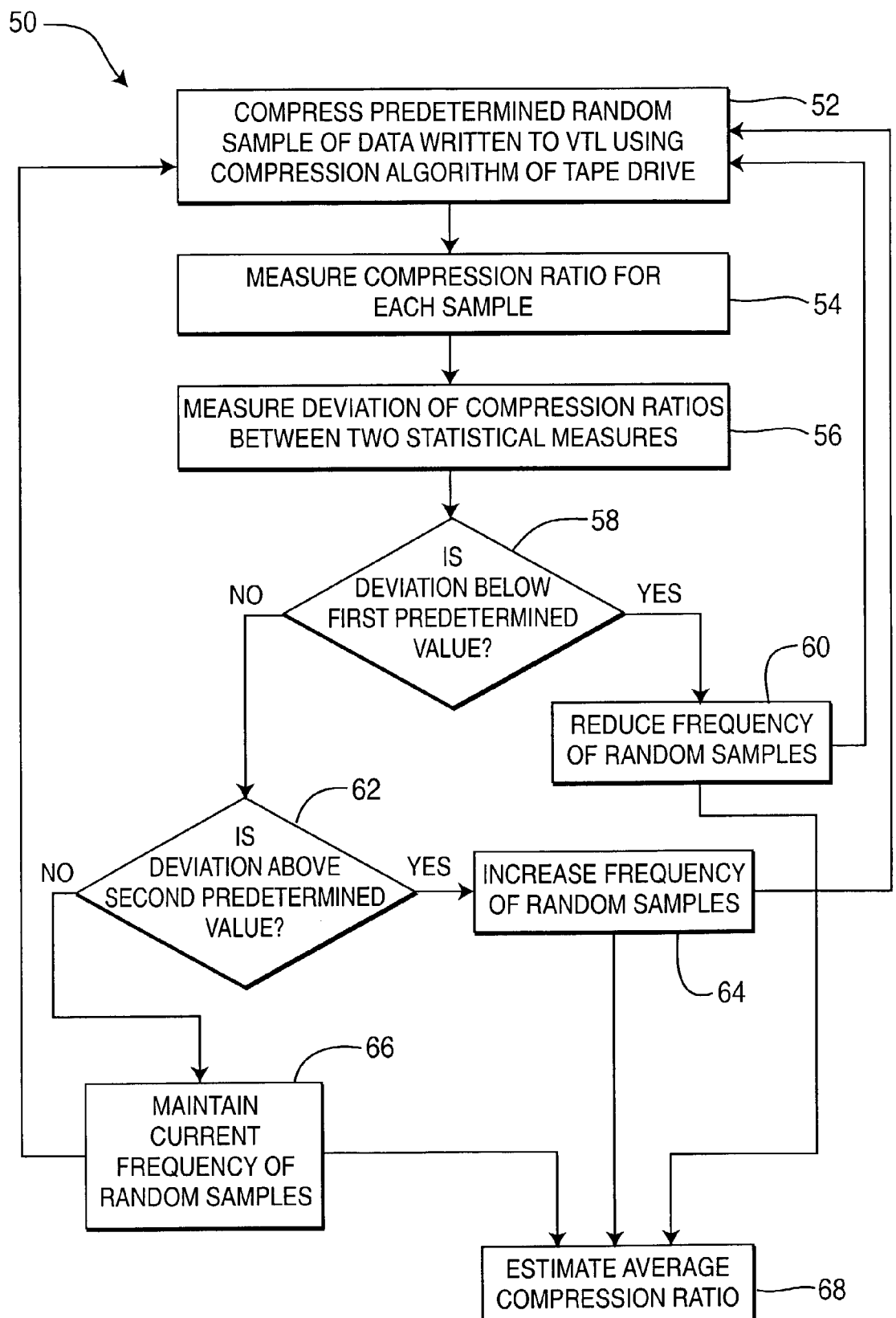
FIG. 2 is a method for computing an estimated compression ratio in accordance with an embodiment of the present invention.

More specifically, FIG. 2 shows a method 50 for computing an estimated compression ratio where data written to a VTL is compressed asynchronously or where the results of any compression performed at the VTL are not used for estimation. The method 50 begins with step 52 wherein a predetermined number of random samples of data written to a VTL are compressed, preferably using the compression algorithm of the physical tape drive. After each sample is taken (or alternatively once all samples have been collected), the actual compression ratio achieved is measured in step 54. In step 56, the deviation of the compression ratios between two statistical measures (for example one involving the current random sample and one not involving the current sample) is computed. Preferably, this measure is the mean of the previous S samples or the mean of all previous samples. However, it could also be a moving average or any other statistical measure that promotes a good estimation of the compressibility of the particular data set.

Once the deviation in the compression ratios has been measured, it is determined in step 58 whether the deviation between the two measures is below a first predetermined value. If yes, the method 50 proceeds to step 60 wherein the frequency of the random samples that are compressed is reduced (unless it is already at a predefined minimum sample frequency). If no, it is determined in step 62 whether the deviation is above a second predetermined value. If yes, the method 50 proceeds to step 64 wherein the frequency of the random samples that are compressed is increased (up to a maximum sample frequency, which could potentially be equivalent to compressing all data). If no, the deviation is within an acceptable range and there is no need to change the frequency of the random samples. In this case, the method 50 proceeds from step 62 to step 66, which simply maintains the current frequency at which the random samples are compressed. Typically, it is not necessary to change the sample frequency because these sequences converge rapidly. However, if it does become necessary to change the sample frequency, it is important to also adjust the weighting of the samples accordingly in order to avoid skewing the results. The overall goal of these procedures is to make the error bound on the estimated average compression ratio as small as possible.

It is important to note that it is not recommended to keep the sampling frequency fixed at this interval. In practice, it is preferable to use the frequency only as a guideline and to randomize the samples around the guideline. For example, before each record is written: (1) Generate a random number in the interval [0,1]; and (2) If the random number is equal to or below the sample frequency (for example $1\% = \frac{1}{100} = 0.01$), use the record as a sample by compressing it—otherwise don't take the sample. This ensures that the samples are independent. In particular, it becomes possible for two consecutive data blocks to be sampled, even if the sample frequency is only $\frac{1}{100}$.

From steps 60, 64, and 66, the method 50 proceeds to step 68. In step 68, the average compression ratio is estimated (along with a confidence interval, etc) for use in step 22 of FIG. 1, for example. When implementing method 50, the method 50 is preferably implemented continuously while data is arriving from the DPA thereby allowing the estimated compression ratio to be computed continuously, as desired. Therefore, it is important to note that, regardless of whether the measured deviation results in a change in the frequency of the random samples (i.e. step 60 or step 64) or not (step 66), the method 50 may return from those steps to step 52 as desired to continually update the estimated compression ratio.

If, referring again to FIG. 1 and method 10, all data written to the VTL is compressed in real-time, computing the estimated compression ratio is a bit simpler than the situation described above. In this case, the compression ratio achieved by the VTL when compressing data may be used, with whatever adjustments are desired, as the estimate of the compression ratio that will be achieved by the tape drive. As mentioned, the compression algorithms used by the tape drive and VTL will likely achieve similar compression ratios for the same data. This is because, in general, compression ratios are more dependent on the data stream than the particular general-purpose compression algorithm that is used.

It is possible, however, that the compression ratios achieved using the VTL's compression algorithms may differ from the compression ratios achieved using the tape drive's compression algorithm. This may be due to a difference in the algorithms themselves or simply as a result of variations arising from implementing similar algorithms in different environments (i.e. using different dictionary sizes, etc). Therefore, this approach should be implemented conservatively. The fact that a VTL compressed a certain data set at a 2.3:1 compression ratio does not mean that the physical tape drive, using a different compression algorithm, will achieve exactly the same compression ratio with the same data. Although the two ratios are likely to be close, it is important to use a more conservative estimate when using this approach, as it is obviously preferable to err on the side of not completely using tape space as opposed to exceeding it (i.e. it is better to under-estimate the compression ratio rather than over-estimate it). That is, it is generally more desirable to err on the side of not using all of a physical tape's capacity rather than introducing the possibility that the virtual tape does not fit on a corresponding physical tape. This is because the latter case needs to be dealt with manually or at least introduces an additional layer of indirection to the restore process.

For example, if all data is compressed in real-time and a 2.3:1 compression ratio is achieved, an estimate of 2.1:1 may be sufficient. Using this lower estimate ensures that the physical tape is used relatively efficiently, while considerably reducing the probability that the virtual tape will not fit on the physical tape upon export. Statistical methods can be used to make this probability bound arbitrarily small. Other methods for estimating the compressibility of data may also be used, as desired.

Once the estimated compression ratio is computed, an "End-Of-Tape" (EOT) signal is provided in step 24 to provide a one-to-one correspondence in size between physical and virtual tapes. The EOT signal is provided based on the estimated compression ratio independently of any compression being implemented by the VTL. It is important to note that the compression ratio is computed dynamically so that the EOT signal may be sent back to the DPA in real-time (i.e. while the DPA is writing data) before the end of a physical tape would be reached if the data were exported from the virtual tape library to the physical tape. For example, assuming a 20 GB physical tape, the EOT signal may be provided after 20 GB of uncompressible data is written to the VTL or after 100 GB of very compressible data is written. In the latter case, the VTL predicts a very high compression ratio for the given data and the algorithm of the tape drive and therefore estimates that five times more data will fit on the physical tape in a compressed format than in an uncompressed format. If this prediction were not performed, the EOT signal would be sent after only 20 GB of data transfer (i.e. once the native capacity of the virtual tape is reached). Consequently, 80% of the physical tape would be wasted. This makes the importance of compression estimation quite apparent and is why it is preferable to implement the compression-ratio-estimation embodiment together with compression as shown in FIG. 1.

When data is exported from a VTL to a physical tape drive, the data compressed by the VTL may be decompressed and exported to the physical drive or directly exported to the physical drive in compressed format. Where the data is decompressed prior to being exported, the data is read (i.e. decompressed) by the VTL before being exported to the physical tape drive. The physical tape drive compresses the data prior to writing it to a physical tape. This approach is utilized where the VTL does not utilize exactly the same compression algorithm of the tape drive. That is, in such situations, decompression of the data by the VTL is necessary because the data has not been compressed in a format which can be decompressed by the physical tape drive. Where data is exported in compressed format, the compression algorithm of the tape drive is disabled and the compression algorithm implemented by the VTL is exactly the same as the compression algorithm implemented by the physical tape drive. That is, the VTL does not just utilize a physical tape drive's compression algorithm to achieve a similar compression result as previously described, but actually uses exactly the same implementation and format as if the algorithm was performed by the tape drive itself. This ensures that data compressed in the VTL may be read (i.e. decompressed) by the physical tape drive when the compressed data is exported directly thereto. In this case, compression performed by the VTL may be used as the estimated compression ratio. This approach provides the benefit of removing a compression/decompression cycle from the workflow, but, as mentioned, requires the VTL to implement exactly the compression algorithm of the physical tape drive.

Figure 3:
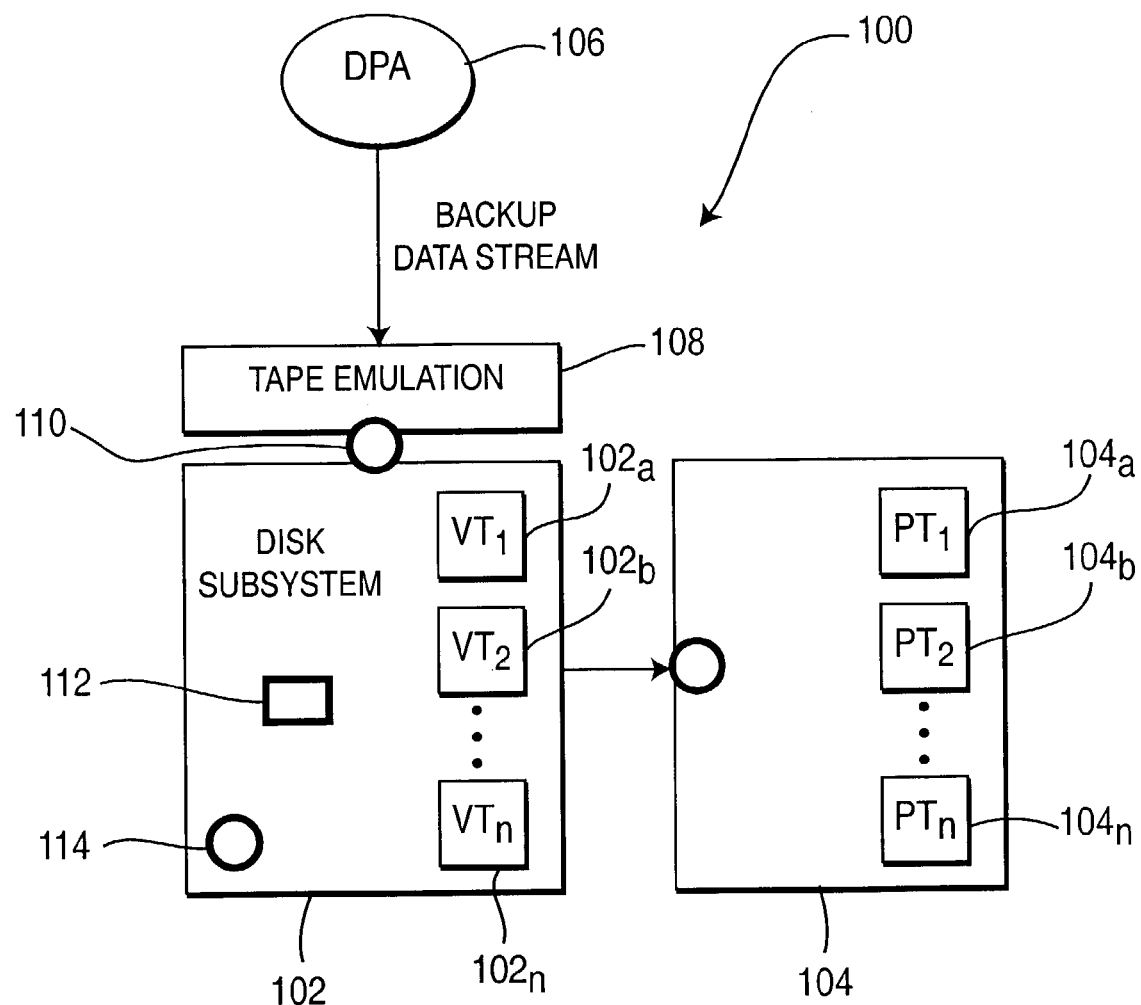
FIG. 3 is a system for compressing data written to a virtual tape library and for computing an estimated compression ratio to provide a one-to-one correspondence in size between virtual and physical tapes in accordance with an embodiment of the present invention.

Referring now to FIG. 3, there is a shown a system 100 wherein data may be compressed in a VTL to conserve storage space in the VTL. The system 100 may also dynamically compute an estimated compression ratio and provide an EOT signal to provide a one-to-one correspondence in size between virtual and physical tapes. The system 100 comprises a VTL 102 and a physical tape library or tape drive 104. The backup data stream is written with a data protection application (DPA) 106 to the VTL 102. Tape emulation 108 is used to emulate a physical tape library or tape drive, causing the DPA to think it is working with a physical tape device when in reality it is working with VTL 102. Details concerning tape emulation may be found in the applicants' co pending U.S. application Ser. No. 10/314,637 entitled Method And System For Emulating Tape Libraries, the entirety of which is hereby incorporated by reference.

A compression estimator/real-time compressor 110 is functionally disposed between the tape emulation 108 and VTL 102, or more specifically the VTL's 102 random access disks that hold virtual tapes. As previously explained, data written to the VTL 102 may be compressed in real-time or asynchronously to optimize the use of disk space within the VTL 102. A processor 112 is provided for dynamically computing an estimated compression ratio as explained herein.

The estimated compression ratio of the physical tape drive enables data stored on virtual tapes 102*a* . . . 102*n* to be written to their corresponding physical tapes 104*a* . . . 104*n* with a one-to-one correspondence in size. For example, if the tape drive has an estimated compression ratio of 2:1 for a given data set and the storage capacity of a given tape 104*a* is 20 Gigabytes, the actual storage capacity of tape 104*a* is 40 Gigabytes for this data. The compression ratio estimated by the processor 112 either based on compression performed by the VTL's 102 compression estimator/real-time compressor 110 or based on method 50 in FIG. 2 will preferably be equal to or slightly less than 2:1. This provides efficient use of the physical tape's 104*a* storage capacity. In this situation, the virtual tape is dynamically adjusted to 40 Gigabytes in size so that when virtual tape 102*a* is exported to physical tape 104*a*, there will be a one-to-one correspondence in size.

The compression estimator/real-time compressor 110 may perform real-time compression as long as there are sufficient resources. Data written to the VTL 102, however, may also be compressed asynchronously. To perform asynchronous compression, the VTL 102 includes a back-end asynchronous compression agent 114. If the incoming data stream is not being compressed in real-time, the agent 114 may compress the incoming data at any time, as desired. The compression of data within the VTL 102 maximizes storage capacity within the VTL 102. If a physical tape needs to be created, the data resident on the corresponding virtual tape is uncompressed and exported to the physical tape. The data may also be exported to a physical tape drive in compressed format where the VTL implements exactly the compression algorithm of the physical tape drive and the physical tape drive's compression feature is disabled.

Although the present invention has been described in detail, it is to be understood that the invention is not limited thereto, and that various changes can be made therein while remaining within scope of the invention, which is defined by the attached claims.

What is claimed is:

1. A method for dynamically computing an estimated compression ratio comprising:
    compressing a predetermined number of random samples of data written to a virtual tape library;
    measuring a compression ratio achieved when the samples are compressed;
    measuring a deviation of compression ratios between two statistical measures;
    computing an average estimated compression ratio of the data written to the virtual tape library; and
    providing an end-of-tape signal based on the average estimated compression ratio indicating when to stop writing data to a virtual tape of the virtual tape library.

2. The method of claim 1 further including the step of compressing data written to the virtual tape library.

3. The method of claim 2 wherein the compression of data and computation of the estimated compression ratio are performed independent of each other.

4. The method of claim 2 wherein data is compressed asynchronously.

5. The method of claim 1 wherein the estimated compression ratio is computed taking into account results of data compression performed on data written to the virtual tape library.

6. The method of claim 1 further including the step of exporting data stored on the virtual tape to a physical tape based on the end-of-tape signal.

7. The method of claim 6 wherein the data is exported in compressed format.

8. The method of claim 6 wherein the data is decompressed prior to being exported to the physical tape.

9. The method of claim 1 wherein the frequency of random samples is adjusted manually.

10. The method of claim 1 wherein the frequency of random samples is adjusted dynamically.

11. The method of claim 1 wherein the frequency of the random samples is reduced when the deviation is below a first predetermined value.

12. The method of claim 1 wherein the frequency of the random samples is increased when the deviation is not below a first predetermined value and is above a second predetermined value.

13. The method of claim 1 wherein the frequency of the random samples is maintained at its current frequency when the deviation is not below a first predetermined value and is not above a second predetermined value.

14. A system for efficiently storing and transferring data in a virtual tape library, the system comprising:
    a compressor compressing data written to the virtual tape library; and
    a compression estimator for computing an estimated compression ratio, the compression estimator;
    configured to compress a predetermined number of random samples of data written to the virtual tape library, measure a compression ratio achieved when the samples are compressed, measure a deviation of compression ratios between two statistical measures, compute an average estimated compression ratio of the data written to the virtual tape library and provide an end-of-tape signal based on the average estimated compression ratio, the end-of-tape signal indicating when to stop writing data to a virtual tape of the virtual tape library.

15. The system of claim 14 wherein the compression estimator computes the estimated compression ratio taking into account results of data compression performed on data written to the virtual tape library.

16. The system of claim 14 wherein the compressor is a back-end asynchronous compression agent for compressing data asynchronously.

* * * * *